United States Patent
An et al.

(10) Patent No.: US 9,145,811 B2
(45) Date of Patent: Sep. 29, 2015

(54) THERMOELECTRIC GENERATOR OF VEHICLE

(71) Applicants: Ho-Chan An, Hwasung-shi (KR); Jong-Ho Seon, Incheon-shi (KR)

(72) Inventors: Ho-Chan An, Hwasung-shi (KR); Jong-Ho Seon, Incheon-shi (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 280 days.

(21) Appl. No.: 13/624,717

(22) Filed: Sep. 21, 2012

(65) Prior Publication Data

US 2013/0152561 A1 Jun. 20, 2013

(30) Foreign Application Priority Data

Dec. 15, 2011 (KR) .................. 10-2011-0135137

(51) Int. Cl.
*F01N 5/02* (2006.01)
*H01L 35/30* (2006.01)

(52) U.S. Cl.
CPC ............... *F01N 5/025* (2013.01); *H01L 35/30* (2013.01); *Y02T 10/16* (2013.01)

(58) Field of Classification Search
CPC ......... F01N 5/025; F01N 9/00; F01N 13/009; F01N 2240/36; F01N 2410/02; F02G 5/02; H01L 35/28; H01L 35/30; Y02T 10/16; Y02T 10/166; Y02T 10/47
See application file for complete search history.

(56) References Cited

U.S. PATENT DOCUMENTS

| | | | |
|---|---|---|---|
| 3,197,342 A * | 7/1965 | Neild, Jr. ........................ | 136/210 |
| 3,794,527 A * | 2/1974 | Chang-Kyo ..................... | 36/208 |
| 5,625,245 A * | 4/1997 | Bass .............................. | 310/306 |
| 7,150,147 B2 * | 12/2006 | Murata ........................... | 60/287 |
| 7,610,993 B2 | 11/2009 | Sullivan | |
| 7,687,704 B2 | 3/2010 | Shimoji et al. | |
| 7,802,424 B2 * | 9/2010 | Kanzawa et al. ............... | 60/324 |
| 7,921,640 B2 | 4/2011 | Major | |
| 8,656,710 B2 * | 2/2014 | Bell et al. ........................ | 60/320 |
| 8,800,263 B2 | 8/2014 | Eder et al. | |
| 2005/0172993 A1 | 8/2005 | Shimoji et al. | |
| 2006/0179820 A1 | 8/2006 | Sullivan | |
| 2009/0126772 A1* | 5/2009 | Machida ....................... | 136/222 |

(Continued)

FOREIGN PATENT DOCUMENTS

EP 2 180 534 A1 4/2010
JP 7-3156 U 1/1995

(Continued)

*Primary Examiner* — Jesse Bogue
(74) *Attorney, Agent, or Firm* — Morgan, Lewis & Bockius LLP

(57) ABSTRACT

A thermoelectric generator apparatus may include a high temperature member having an exhaust pipe, a ring-shaped first heat transfer plate surrounding the exhaust pipe, and a plurality of first heat exchange pins radially extending outwards from the first heat transfer plate in a predetermined degree, a low temperature member having an internal casing surrounding the exhaust pipe, an external casing surrounding the internal casing with a predetermined gap, a ring-shaped second heat transfer plate contacting with an internal wall of the internal casing, and a plurality of second heat exchange pins radially extending inwards from the second heat transfer plate in a predetermined angle, and a plurality of thermoelectric modules being in contact with the first heat exchange pins and the second heat exchange pins so as to generate electricity using a thermoelectric phenomenon caused by a temperature gap between the first heat exchange pins and the second heat exchange pins.

4 Claims, 4 Drawing Sheets

(56) References Cited

U.S. PATENT DOCUMENTS

| | | |
|---|---|---|
| 2010/0186399 A1 | 7/2010 | Hüttinger |
| 2010/0186422 A1 | 7/2010 | Yang et al. |
| 2011/0146743 A1* | 6/2011 | Oesterle et al. ............... 136/210 |
| 2011/0308560 A1* | 12/2011 | Arbuckle et al. ............. 136/205 |
| 2012/0060484 A1* | 3/2012 | Eder et al. ...................... 60/320 |
| 2012/0118344 A1 | 5/2012 | Schluck et al. |

FOREIGN PATENT DOCUMENTS

| | | |
|---|---|---|
| JP | 10-290590 A | 10/1998 |
| JP | 2005-223131 A | 8/2005 |
| JP | 2006-214350 A | 8/2006 |
| JP | 2006-314180 A | 11/2006 |
| JP | 2007-37319 A | 2/2007 |
| JP | 2007-154698 A | 6/2007 |
| JP | 2007-210561 A | 8/2007 |
| JP | 2007-236122 A | 9/2007 |
| JP | 2008-189162 A | 8/2008 |
| JP | 2009-278767 A | 11/2009 |
| JP | 2010-245265 A | 10/2010 |
| KR | 10-2005-0091750 A | 9/2005 |
| KR | 10-2011-0010782 A | 2/2011 |

* cited by examiner

B-B'

THERMOELECTRIC GENERATOR OF VEHICLE

CROSS-REFERENCE TO RELATED APPLICATION

The present application claims priority to Korean Patent Application No. 10-20110135137, filed on Dec. 15, 2011, the entire contents of which is incorporated herein for all purposes by this reference.

BACKGROUND OF THE INVENTION

1. Field of the Invention

The present invention relates to a thermoelectric generator of vehicle, and more particularly, to a thermoelectric generator of vehicle, which uses the heat of the exhaust gas of an automobile to generate electricity.

2. Description of Related Art

A thermoelectric element is an element, which uses a thermoelectric phenomenon, in which thermal energy is converted to electric energy by converting the temperature gap between the two ends of an element into electricity, or in which electric energy is converted to thermal energy by having electricity run through an element and by causing the temperature gap in the two ends. Such thermoelectric element is used in a small scale cooling, heating or generating device.

When a thermoelectric element is used in a small scale generating device, it is called a thermoelectric generation device or a thermoelectric generator. This device is mainly used in a power supply unit of a wireless communication device, of a spaceship and of a nuclear-powered submarine as well as in a thermoelectric generator installed in an exhaust system of a vehicle.

FIG. 1 is a cross-sectional view illustrating a thermoelectric generator of a vehicle.

As illustrated, a thermoelectric generator installed in an exhaust system of a vehicle 10 comprises; a hexagonal exhaust heat recovering device 40, which high-temperature exhaust gas passes through; a cooling device 30, which is installed outside of the exhaust heat recovering device 40 and inside of which coolant passes through; and the plurality of thermoelectric modules 20, which are in contact with the exterior of the exhaust heat recovering device 40 and with the interior of the cooling device 30 to generate electricity using the temperature gap between the two ends.

Inside the exhaust heat recovering device 40, high-temperature exhaust gas runs and it conveys thermal energy to the thermoelectric modules 20. Inside the cooling device 30 is formed a cooling pipe, which increases the temperature gap between the interior of the thermoelectric modules 20 in contact with the exhaust heat recovering device 40 and the exterior of the thermoelectric modules 20 in contact with the cooling device 30. As the temperature gap between the interior and the exterior of the thermoelectric module increases 20, the efficiency of the thermoelectric generator installed in the exhaust system of a vehicle increases.

In order to generate lots of electricity in a thermoelectric generator, i.e. to increase the thermoelectric generation efficiency, thermal energy of the exhaust gas must be conveyed to the thermoelectric modules efficiently. However, in the traditional thermoelectric generator of a vehicle, thermal energy of the exhaust gas is not conveyed to the high temperature member sufficiently, so the recovery rate of the thermal energy of the exhaust gas drops and hence, the thermoelectric efficiency of a thermoelectric generator drops.

Also, in the traditional thermoelectric generator of a vehicle, although a cooling device 30 occupies a great area, the heat-exchange area is small, and therefore, the heat conveyance rate is low compared to the size, and the efficiency of thermoelectric generation is low.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a small thermoelectric generator of a vehicle, with the improved efficiency of the thermoelectric generation.

The technical problems that the present invention is set out to solve are not limited to the ones mentioned above, and those that are not mentioned shall be clearly understood by a person skilled in the art from looking at the specification of the present invention.

In an aspect of the present invention, a thermoelectric generator apparatus of a vehicle may include a high temperature member having an exhaust pipe, wherein high-temperature exhaust gas passes therethrough, a ring-shaped first heat transfer plate surrounding the exhaust pipe, wherein the exhaust pipe exchanges heat with the first heat transfer plate, and a plurality of first heat exchange pins radially extending outwards from the first heat transfer plate in a predetermined degree, a low temperature member having an internal casing surrounding the exhaust pipe, an external casing surrounding the internal casing with a predetermined gap to form a coolant flow route therebetween, a ring-shaped second heat transfer plate contacting with an internal wall of the internal casing, and a plurality of second heat exchange pins radially extending inwards from the second heat transfer plate in a predetermined angle, and a plurality of thermoelectric modules, which is formed by joining a P-shaped semiconductor and an N-shaped semiconductor, and a side of each of which is in contact with the first heat exchange pins, and the other side of each of which is in contact with the second heat exchange pins so as to generate electricity using a thermoelectric phenomenon caused by a temperature gap between the first heat exchange pins and the second heat exchange pins.

The high temperature member may further include a bypass pipe, which is installed inside the exhaust pipe with a predetermined gap and through which the exhaust gas bypasses, a bypass valve, which is installed on a distal end of the bypass pipe and controls the quantity of the exhaust gas being bypassed through the bypass pipe, an elastic member supporting the bypass valve elastically at the distal end of the bypass pipe, and a heat transfer mesh mounted between the exhaust pipe and the bypass pipe to heat the exhaust pipe by exchanging heat with the exhaust gas.

The low temperature member may further include a coolant inlet arranged on a side thereof where the coolant flows in, and a coolant outlet arranged on the other side thereof where the coolant flows out, and a plurality of coolant baffles installed between the internal casing and the external casing, and a side of each of which is opened so that the opened sides form a fixed angle, wherein the coolant inlet is formed on a lower flow route of the exhaust gas, and the coolant outlet is formed on an upper flow route of the exhaust gas.

A coolant in the internal casing, the external casing and the plurality of baffles flows along a flow route in the opposite direction of the direction of the coolant flowing along an adjacent flow route.

A direction the coolant flows is opposite to the direction the exhaust gas flows.

The bypass pipe may include an exhaust hole fluid-connecting an inner space of the bypass pipe and a space formed between the bypass pipe and the exhaust pipe.

In accordance with the present invention's thermoelectric generator of a vehicle, there is the effect of the size of the entire thermoelectric generator being small although the contact area between the exhaust gas and the thermoelectric modules is large.

Also, the effect of the fuel efficiency being improved can be brought about since the present invention is installed in the engine of a vehicle and generates electricity, and it can help the generator already installed to charge the batteries.

By being installed between the high temperature member and the thermoelectric modules, the heat transfer mesh can increase the contact area between the exhaust gas and the thermoelectric modules, and therefore, thermal energy of the exhaust gas is more efficiently conveyed to the thermoelectric modules, and the noise from the exhaust gas passing through the thermoelectric modules is reduced as well.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
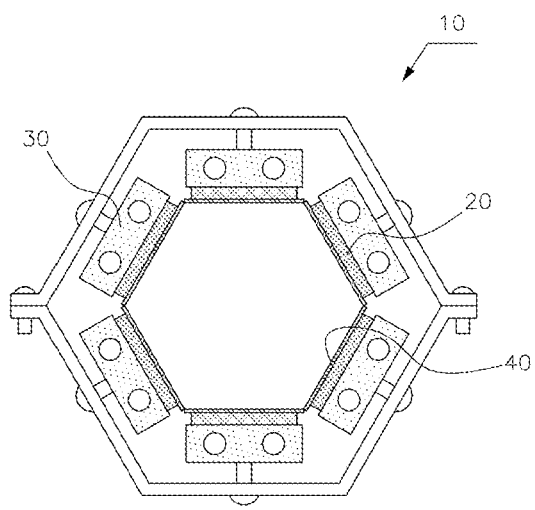
FIG. 1 is a cross sectional view of a traditional thermoelectric generator of a vehicle.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereafter, with reference to the attached drawings, the preferred embodiment of the present invention will be described in detail. Before proceeding, it should be noted that the terminologies and words used on this specification and in the claims are not to be interpreted solely as the general or dictionary meanings, and they should be interpreted as the meanings and the concept which correspond with the technological ideas of the present invention based on the principle that the inventor can properly define the concept of the terminologies in order to explain his own invention in the best possible way. Therefore, the compositions described in the embodiments and the drawings of this specification are merely the most preferred types of embodiment and they do not represent the entire technological ideas of the present invention, and thus, it should be understood that there can be a variety of equivalents and alterations, which can replace these embodiments at the time of filing this application.

Figure 2:
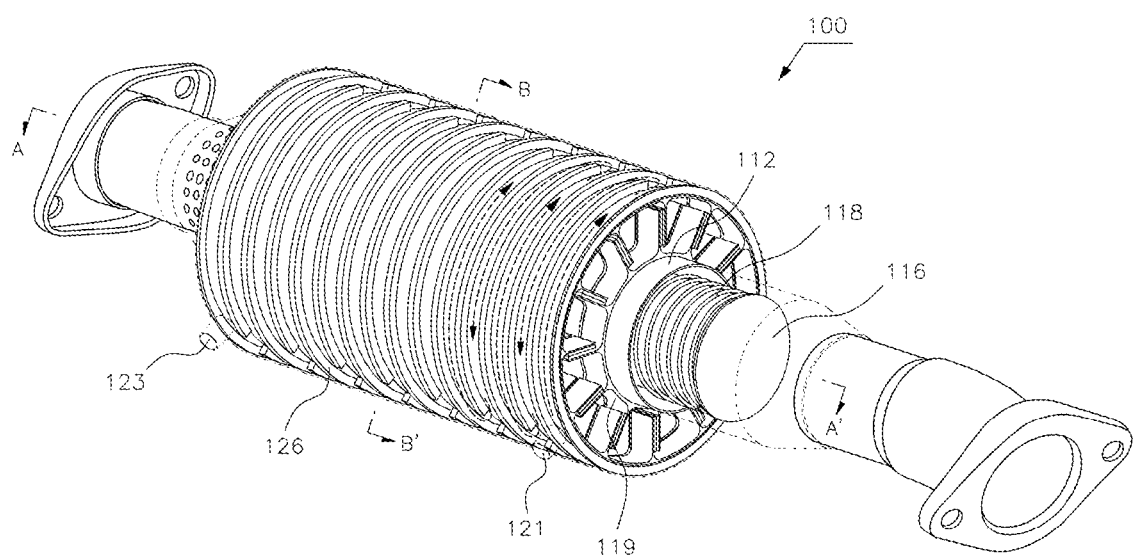
FIG. 2 is a perspective view of a thermoelectric generator of a vehicle according to an exemplary embodiment of the present invention.
Figure 3:
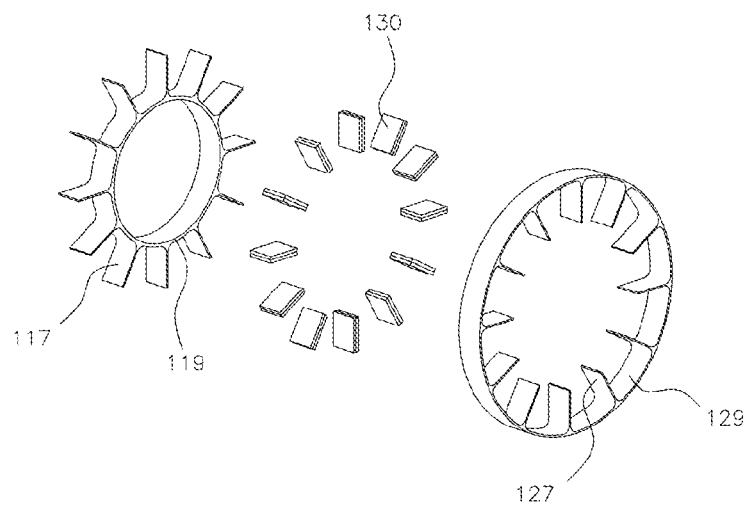
FIG. 3 is an exploded perspective view illustrating a first heat transfer plate, a second heat transfer plate and thermoelectric modules of a thermoelectric generator of a vehicle according to an exemplary embodiment of the present invention.
Figure 4:
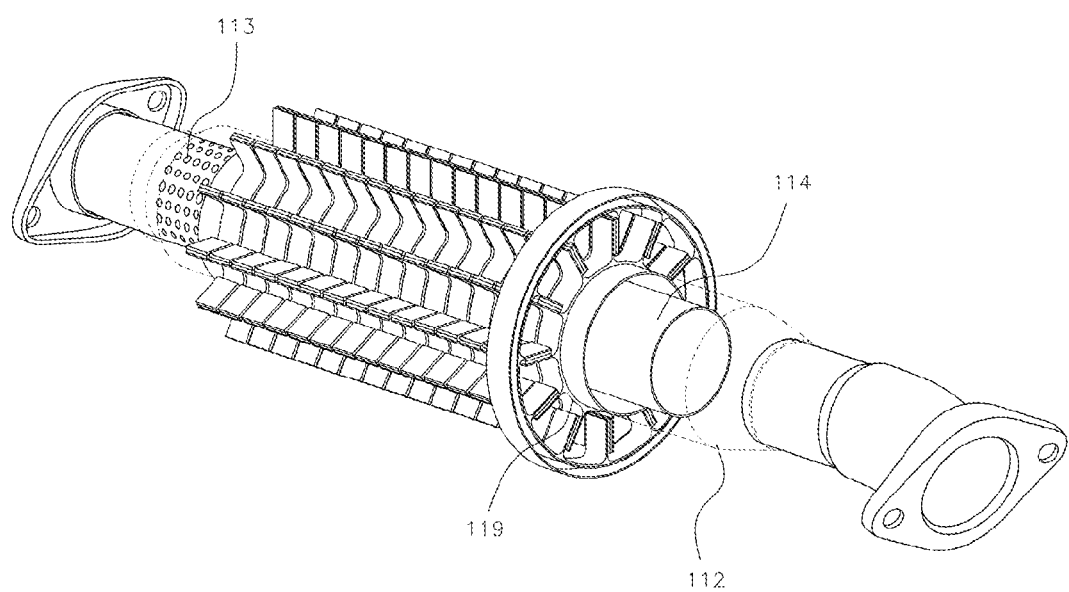
FIG. 4 is a perspective view of a thermoelectric generator of a vehicle according to an exemplary embodiment of the present invention illustrating a first heat transfer plate, a second heat transfer plate and thermoelectric modules installed on the exhaust pipe.
Figure 5:
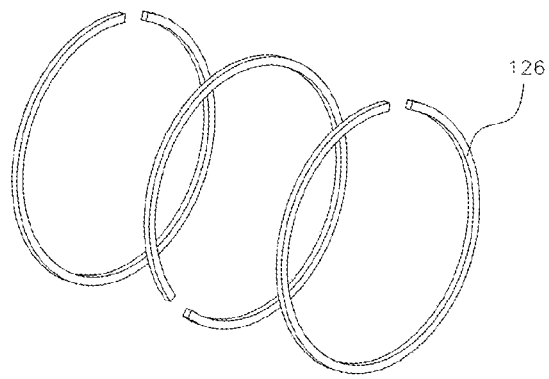
FIG. 5 is conceptual diagram explaining the installation of a baffle used in the low temperature member of a thermoelectric generator according to an exemplary embodiment of the present invention.
Figure 6:
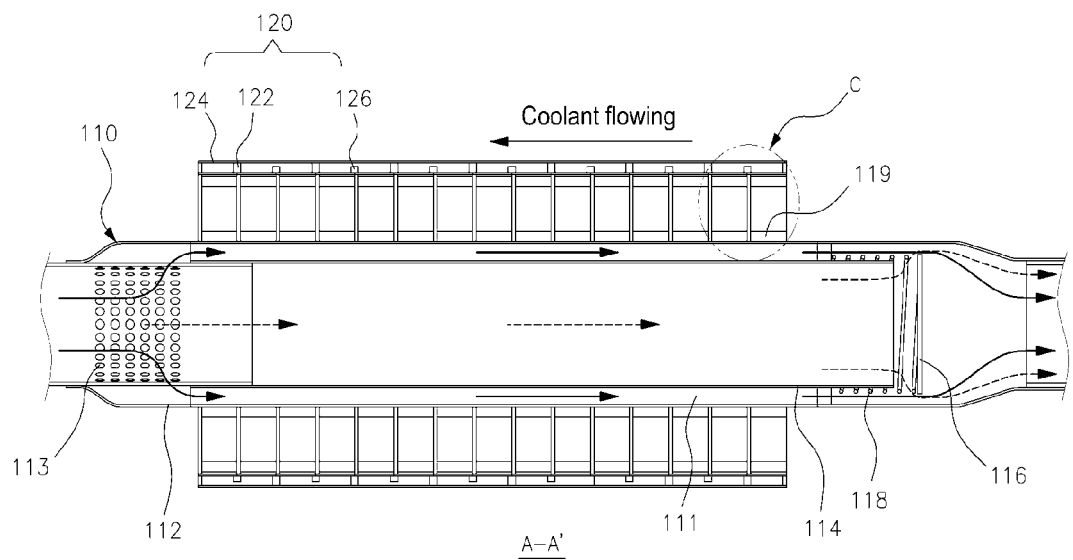
FIG. 6 is a cross sectional view of FIG. 2 cut through the line A-A'.
Figure 7:
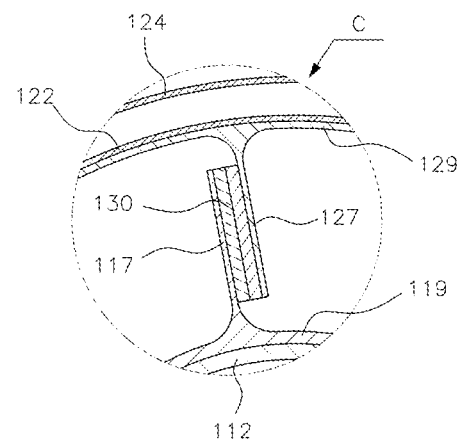
FIG. 7 is a magnified cross sectional view of the 'C' portion of FIG. 6.
Figure 8:
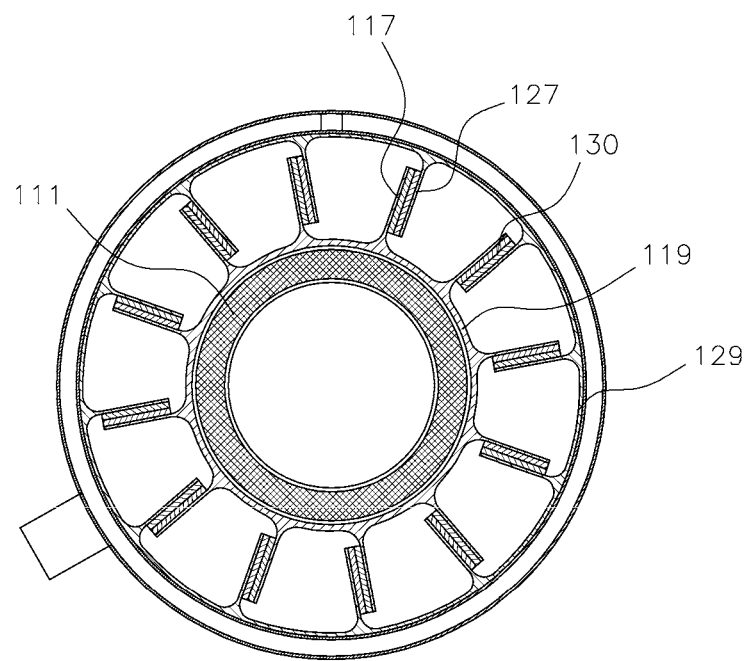
FIG. 8 is a cross sectional view of FIG. 2 cut through the line B-B'.

FIG. 2 is a perspective view of a thermoelectric generator of a vehicle according to an exemplary embodiment of the present invention. FIG. 3 is an exploded perspective view illustrating a first heat transfer plate, a second heat transfer plate and thermoelectric modules of a thermoelectric generator of a vehicle according to an exemplary embodiment of the present invention. FIG. 4 is a perspective view of a thermoelectric generator of a vehicle according to an exemplary embodiment of the present invention illustrating a first heat transfer plate, a second heat transfer plate and thermoelectric modules installed on the exhaust pipe. FIG. 5 is conceptual diagram explaining the installation of a baffle used in the low temperature member of a thermoelectric generator according to an exemplary embodiment of the present invention. FIG. 6 is a cross sectional view of FIG. 2 cut through the line A-A'. FIG. 7 is a magnified cross sectional view of the 'C' portion of FIG. 6. FIG. 8 is a cross sectional view of FIG. 2 cut through the line B-B'.

As illustrated, a thermoelectric generator 100 of a vehicle according to an exemplary embodiment of the present invention includes a high temperature member 110, which is heated in the process of heat exchange with the high-temperature exhaust gas emitted from the engine, a low temperature member 120, which is installed outside of the high temperature member 110 and through which the coolant circulated by the cooling system of the engine passes, and thermoelectric modules 130, which lie between the high temperature member 110 and the low temperature member 120 and generate electricity using the temperature gap between the high temperature member 110 and the low temperature member 120.

The high temperature member 110 includes an exhaust pipe 112, which becomes heated while the high-temperature exhaust gas passes through it, a first heat transfer plate 119, which is installed on the exterior wall of the exhaust pipe, and a plurality of first heat exchange pins 117, which is formed as one body with the first heat transfer plate 119 and is arranged radially at a fixed angle.

The exhaust pipe 112 has the shape of a hollow cylinder and is heated by the high-temperature exhaust gas passing through it. The exhaust pipe 112, that is heated, heats up the first heat transfer plate 119 installed on its exterior wall, and the plurality of first heat exchange pins 117, which is formed as one body with the heat transfer plate 119, is heated by the heat transfer plate 119.

Inside the exhaust pipe 112 is installed a bypass pipe 114, through which the exhaust gas bypasses. On the end of the bypass pipe 114 is installed a bypass valve 116, which opens and closes the end of the bypass pipe 114 so that the exhaust gas can bypass it depending on the engine load. The bypass Valve 116 is elastically supported by a spring 118 from the bypass pipe 114. On the upper flow route of the bypass pipe 114 is formed a plurality of exhaust holes 113, which the exhaust gas flows through when the bypass valve 116 is closed.

A heat exchange mesh 111 lies between the exterior wall of the bypass pipe 114 and the internal wall of the exhaust pipe 112. The heat exchange mesh 111 exchanges heat with the high-temperature exhaust gas and absorbs thermal energy from the exhaust gas and conveys it to the exhaust pipe 112. In other words, thermal energy of the exhaust gas is efficiently conveyed to the exhaust pipe 112 by the heat exchange mesh 111.

When a vehicle is moving at a high speed, i.e. when the engine load increases, the exhaust pipe can rupture. To prevent this from happening, the bypass valve 116 is opened when the engine load is high, and most of the high-temperature exhaust gas is emitted through the bypass pipe 114 and the quantity of the exhaust gas passing between the bypass pipe 114 and the exhaust pipe 112 is controlled.

Outside of the high temperature member 110, i.e. outside of the exhaust pipe 112 is installed the low temperature member 120. The low temperature member 120 is formed as one body with an internal casing 122 installed outside the exhaust pipe 112, an external casing 124 forming a coolant flow route together with the internal casing 122, a ring-shaped second heat transfer plate 129 installed in a way that it is in contact with the internal wall of the internal casing 122, and a plurality of second heat exchange pins 127, which is formed as one body with the second heat transfer plate 129 on the internal wall of the second heat transfer plate 129 and is arranged at a fixed angle.

The internal casing 122 and the external casing 124 form concentric circles with the exhaust pipe 112. The external casing 124 includes a coolant inlet 121, which is arranged on its one side and which the coolant flows into, and a coolant outlet 123, which is arranged on its other side and which the coolant flows out.

The low temperature member 120 having the internal casing 122 and the external casing 124 further includes a plurality of coolant baffles 126, of which one sides are opened and these opened sides are arranged in a fixed angle.

Each of the many coolant baffles 126 has the shape of a ring and a part of each coolant baffle is opened. The opened portion of a coolant baffle 126 and the opened portion of an adjacent coolant baffle are set to form a fixed angle, preferably, a 90-degree angle. Since the plurality of coolant baffles 126 is installed the way it is installed, coolant can flow in the opposite direction of the flow route of the coolant formed by the adjacent baffle 126, as illustrated in FIG. 2. The reason that the directions of the coolant are set to be the opposite of each other is to keep the temperature of a low temperature member 120 constant. Also, the coolant inlet 121 is formed on the lower flow route of the exhaust pipe 112, and the coolant outlet 123 is formed on the upper flow route of the exhaust pipe 112. In other words, the direction the coolant flows to is opposite of the direction the exhaust gas flows to, and hence, it is possible to keep the temperature of the high temperature member 110 and the temperature of the low temperature member 120 constant, which makes it possible to generate electricity consistently in the thermoelectric modules 130.

The thermoelectric modules 130 are formed by joining a P-shaped semiconductor and an N-shaped semiconductor, and they radially lie between the plurality of first heat exchange pins 117 of the high temperature member 110 and the plurality of second heat exchange pins 127 of the low temperature member 120. As stated above, the first heat exchange pins 117 are heated by the first heat transfer plate 119 to reach a high temperature, and the second heat exchange pins 127 reaches a low temperature by the second heat transfer plate 129, and therefore, the temperature gap occurs in the two sides of the thermoelectric modules 130 lying between the first heat exchange pins 117 and the second heat exchange pins 127. Thus, if the temperature gap occurs in the two sides of the thermoelectric modules 130, electricity is generated inside the plurality of thermoelectric modules 130.

Each of the plurality of thermoelectric modules 130 is equipped with a pair of electric terminal and is connected to each other electrically. Also, the electrically interconnected plurality of thermoelectric modules 130 are electrically connected to a vehicle's battery not illustrated electrically and charge the battery using the electricity generated by the thermoelectric phenomenon.

Applications of a thermoelectric generator according to an exemplary embodiment of the present invention is explained below.

If an engine is run, the exhaust gas is emitted from the engine and flows into the exhaust pipe 112, and at this moment the bypass valve 116 closes the bypass pipe 114. Moreover, coolant circulated by the engine's cooling system not illustrated flows into the coolant inlet 121.

The exhaust gas flows inside the exhaust pipe 112 and exchanges the heat with the exhaust pipe 112, which is heated in the process. The first heat transfer plate 119 installed on the exterior wall of the exhaust pipe 112 is heated by the heated exhaust pipe 112, and thermal energy of the exhaust gas is conveyed to the plurality of the first heat exchange pins 117 by the heated first heat transfer plate 119 so that one side of the plurality of thermoelectric modules 130 is heated.

Meanwhile, the coolant that flows into the coolant inlet 121 flows through the coolant flow routes formed by baffles 126 adjacent to the inside of the internal and external casings 122, 124, and when the coolant flows through the coolant flow routes, it flows in a way that it alternates in the direction it flows. The second heat transfer plate 129 is cooled down by the flowing coolant, and hence the second heat exchange pins 127, which is formed in one body with the second heat transfer plate 129 is cooled down. The other side of the plurality of the thermoelectric modules 130 in contact with the cooled-down plurality of second heat exchange pins 127 is cooled down as well.

Thus, a temperature gap occurs between the sides of the plurality of thermoelectric modules 130 that are arranged radially. Electricity is generated inside the plurality of thermoelectric modules 130 by the temperature gap. Electricity generated by the plurality of thermoelectric modules 130 charges the battery electrically connected to the plurality of thermoelectric modules 130.

If the speed of a vehicle increases, i.e. if the load of its engine increases, the bypass valve 116 beats the spring's 118 elasticity and opens the bypass pipe 114. As the bypass pipe 114S is opened, most of the exhaust gas is emitted through the bypass pipe 114, and the rest flows between the bypass pipe 114 and the exhaust pipe 112. The heat exchange mesh 111 lying between the bypass pipe 114 and the exhaust pipe 112 exchanges heat with the exhaust gas and heats up the exhaust pipe 112, and the remaining process thereafter is identical to the process when the bypass valve 116 is closed, so further explanation will be omitted.

Thus, since a plurality of thermoelectric modules can be used, lots of electricity can be generated, and using the electricity thereof, the battery of a vehicle can be charged and the fuel efficiency of the vehicle will be increased.

Furthermore, according to a thermoelectric generator of a vehicle of an embodiment of the present invention, while the exhaust gas exchanges heat with the heat exchange mesh, the noise of the exhaust gas is reduced, and the thermoelectric efficiency is increased since the contact area between a high temperature member and thermoelectric modules is large and the other side of the plurality of thermoelectric modules is cooled down by a low temperature member quickly. Therefore, a thermoelectric generator of a vehicle smaller than one by the prior art can be realized.

For convenience in explanation and accurate definition in the appended claims, the terms "upper", "lower", "inner" and "outer", are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generator apparatus of a vehicle comprising;
   a high temperature member having:
   an exhaust pipe, wherein high-temperature exhaust gas passes therethrough;
   a ring-shaped first heat transfer plate surrounding the exhaust pipe, wherein the exhaust pipe exchanges heat with the first heat transfer plate; and
   a plurality of first heat exchange pins radially extending outwards directly from the first heat transfer plate in a predetermined degree;
   a low temperature member having:
   an internal casing surrounding the exhaust pipe;
   an external casing surrounding the internal casing with a predetermined gap to form a coolant flow route therebetween,
   a ring-shaped second heat transfer plate contacting with an internal wall of the internal casing; and
   a plurality of second heat exchange pins radially extending inwards from the second heat transfer plate in a predetermined angle; and
   a plurality of thermoelectric modules, which is formed by joining a P-shaped semiconductor and an N-shaped semiconductor, and a side of each of which is in contact with the first heat exchange pins, and the other side of each of which is in contact with the second heat exchange pins so as to generate electricity using a thermoelectric phenomenon caused by a temperature gap between the first heat exchange pins and the second heat exchange pins,
   wherein the high temperature member further includes a bypass pipe, which is installed inside the exhaust pipe with a predetermined gap and through which the exhaust gas bypasses;
   wherein a bypass valve, which is installed on a distal end of the bypass pipe and controls the quantity of the exhaust gas being bypassed through the bypass pipe;
   wherein an elastic member supporting the bypass valve elastically at the distal end of the bypass pipe; and
   wherein a heat transfer mesh mounted between the exhaust pipe and the bypass pipe to heat the exhaust pipe by exchanging heat with the exhaust gas, and
   wherein the low temperature member further includes a coolant inlet arranged on a side thereof where the coolant flows in, and a coolant outlet arranged on the other side thereof where the coolant flows out; and
   wherein a plurality of coolant baffles installed between the internal casing and the external casing, and a side of each of which is opened so that the opened sides form a fixed angle, wherein the coolant inlet is formed on a lower flow route of the exhaust gas, and the coolant outlet is formed on an upper flow route of the exhaust gas.

2. The generator apparatus according to claim 1, wherein a coolant flows along a flow route in the opposite direction of the direction of the coolant flowing along an adjacent flow route.

3. The generator apparatus according to claim 1, wherein a direction the coolant flows is opposite to the direction the exhaust gas flows.

4. The generator apparatus according to claim 1, wherein the bypass pipe includes an exhaust hole fluid-connecting an inner space of the bypass pipe and a space formed between the bypass pipe and the exhaust pipe.

* * * * *